United States Patent
Yokoyama et al.

(10) Patent No.: US 10,734,433 B2
(45) Date of Patent: Aug. 4, 2020

(54) SOLID-STATE IMAGING DEVICE

(71) Applicant: TOWERJAZZ PANASONIC SEMICONDUCTOR CO., LTD., Uozu, Toyama (JP)

(72) Inventors: Toshifumi Yokoyama, Toyama (JP); Yoshiaki Nishi, Kyoto (JP); Masakatsu Suzuki, Niigata (JP); Hiroshi Masuda, Niigata (JP)

(73) Assignee: TowerJazz Panasonic Semiconductor Co., Ltd., Uozu, Toyama (JP)

( * ) Notice: Subject to any disclaimer, the term of this patent is extended or adjusted under 35 U.S.C. 154(b) by 1 day.

(21) Appl. No.: 16/045,131

(22) Filed: Jul. 25, 2018

(65) Prior Publication Data
US 2018/0331148 A1 Nov. 15, 2018

Related U.S. Application Data

(63) Continuation of application No. PCT/JP2017/002473, filed on Jan. 25, 2017.

(30) Foreign Application Priority Data

Jan. 29, 2016 (JP) .................................. 2016-014962

(51) Int. Cl.
*H01L 27/146* (2006.01)
*H04N 5/3745* (2011.01)
(Continued)

(52) U.S. Cl.
CPC .......... *H01L 27/14645* (2013.01); *G02B 1/11* (2013.01); *H01L 27/1461* (2013.01);
(Continued)

(58) Field of Classification Search
None
See application file for complete search history.

(56) References Cited

U.S. PATENT DOCUMENTS

2006/0049476 A1* 3/2006 Koizumi ........... H01L 27/14627
257/432
2009/0104729 A1 4/2009 Koizumi
(Continued)

FOREIGN PATENT DOCUMENTS

EP 2375448 A2 10/2011
JP 200673882 A 3/2006
(Continued)

OTHER PUBLICATIONS

International Search Report for corresponding application PCT/JP2017/002473 filed Jan. 25, 2017; dated Apr. 18, 2017.

*Primary Examiner* — Charles D Garber
*Assistant Examiner* — Steven M Christopher
(74) *Attorney, Agent, or Firm* — Knobbe, Martens, Olson & Bear, LLP

(57) ABSTRACT

A solid state imaging device has a global shutter structure and includes: a photodetector; a wiring layer; a first transparent insulating film disposed immediately above the photodetector and penetrating the wiring layer; a transparent protective film covering the wiring layer and the first transparent insulating film, and having a higher refractive index than the first transparent insulating film; a first projection provided on the transparent protective film and having a quadrilateral shape in top view; and a second transparent insulating film having a lower refractive index than the first projection.

13 Claims, 13 Drawing Sheets

(51) Int. Cl.
*G02B 1/11* (2015.01)
*H04N 5/357* (2011.01)

(52) U.S. Cl.
CPC .. *H01L 27/14621* (2013.01); *H01L 27/14625* (2013.01); *H01L 27/14627* (2013.01); *H01L 27/14629* (2013.01); *H01L 27/14685* (2013.01); *H04N 5/3572* (2013.01); *H04N 5/3745* (2013.01); *H01L 27/14623* (2013.01); *H01L 27/14636* (2013.01)

(56) References Cited

U.S. PATENT DOCUMENTS

| | | |
|---|---|---|
| 2010/0221864 A1 | 9/2010 | Koizumi |
| 2010/0301438 A1 | 12/2010 | Ogino |
| 2012/0288979 A1 | 11/2012 | Koizumi |
| 2014/0054663 A1 | 2/2014 | Koizumi |
| 2014/0063303 A1 | 3/2014 | Masuda |
| 2015/0008494 A1 | 1/2015 | Koizumi |
| 2015/0108598 A1* | 4/2015 | Kambe ............ H01L 27/14603 257/432 |
| 2016/0049438 A1* | 2/2016 | Murata ............ H01L 27/14603 257/229 |
| 2016/0126280 A1 | 5/2016 | Koizumi |
| 2017/0092680 A1* | 3/2017 | Kwon ............... H01L 27/11582 |

FOREIGN PATENT DOCUMENTS

| | | |
|---|---|---|
| JP | 200816722 A | 1/2008 |
| JP | 2008192951 A | 8/2008 |
| JP | H11040787 A | 2/2011 |
| JP | 201449575 A | 3/2014 |
| JP | 2014107596 A | 6/2014 |
| JP | 2015138918 A | 7/2015 |
| JP | 2015167219 A | 9/2015 |

* cited by examiner

SOLID-STATE IMAGING DEVICE

CROSS-REFERENCE TO RELATED APPLICATIONS

This is a continuation of International Application No. PCT/JP2017/002473 filed on Jan. 25, 2017, which claims priority to Japanese Patent Application No. 2016-014962 filed on Jan. 29, 2016. The entire disclosures of these applications are incorporated by reference herein.

BACKGROUND

The present disclosure relates to a solid-state imaging device having a global shutter structure.

Shutter methods for image sensors (solid-state imaging devices) include a rolling shutter method in which rows are exposed to light sequentially from an upper one to a lower one, and a global shutter method in which all rows are simultaneously exposed to light. For CMOS solid-state imaging devices, the rolling shutter method has been widely adopted. However, a solid-state imaging device having a rolling shutter structure causes image distortion (so-called focal plane distortion) when capturing the image of an object moving at a high speed.

In view of this problem, CMOS solid-state imaging devices with a global shutter structure have been proposed recently. In such a solid-state imaging device having the global shutter structure, memories are formed on a semiconductor substrate, apart from photodiodes. Signals are simultaneously read from all the photodiodes to the memories, and then, the signals are sequentially read out from the memories. In this manner, an image without distortion can be captured. For this reason, it is required to employ the solid-state imaging devices with the global shutter structure as industrial cameras that need to identify an object moving at a high speed, high-end cameras, and similar cameras.

On the other hand, in order to obtain high-quality images without increasing the size of the solid-state imaging device, the size of each of cells included in the solid-state imaging device tends to be reduced. However, as the cell size is reduced, it becomes difficult to condense light that has entered in the cell. It is therefore needed to realize a high-sensitivity solid-state imaging device capable of efficiently collecting incident light despite a decrease in the cell size.

Japanese Unexamined Patent Publication Nos. H11-040787 and 2006-73882 each describe a solid-state imaging device including an intra-layer lens provided above a plurality of wiring layers and covering a region above a photodetector, and an on-chip lens provided above the intra-layer lens. In the solid-state imaging device described in each of these patent documents, the incident light condensed by the on-chip lens is more effectively collected to the photodetector by the intra-layer lens having a substantially hemispherical shape which is upwardly convex.

Japanese Unexamined Patent Publication No. 2008-192951 describes a solid-state imaging device including an optical waveguide disposed between a photodetector and an intra-layer lens and penetrating a plurality of wiring layers. In the solid-state imaging device described in this patent document, since light that has entered the optical waveguide is guided to the photodetector while being confined in the optical waveguide, the light-gathering efficiency is improved.

SUMMARY

In a semiconductor substrate of a solid-state imaging device employing the global shutter method, a memory for retaining charge is provided close to each photodetector. Therefore, reduction of the cell size involves shortening of a distance between the photodetector and the memory.

Meanwhile, in the solid-state imaging device described in each of Japanese Unexamined Patent Publication Nos. H11-040787 and 2006-73882, most of the light condensed by the intra-layer lens is oblique with respect to the photodetector. For this reason, if the cell size of the solid-state imaging device described in these patent documents is reduced, part of the oblique light directly enters the memory, causing a risk of increase in a noise component.

The optical waveguide described in Japanese Unexamined Patent Publication No. 2008-192951 is formed in the following manner. Following the formation of a hole by once removing a portion of an interlayer insulating film located above the photodetector, the hole above the photodetector is filled with a constituent material. Therefore, reduction of the cell size makes it difficult to form the optical waveguide.

In view of the foregoing problems, it is therefore an object of the present disclosure to provide a solid-state imaging device employing the global shutter method, and capable of maintaining a high sensitivity and reducing optical noise, despite a decrease in a cell size.

A solid-state imaging device disclosed herein includes: a substrate; a plurality of photodetectors provided in an upper portion of the substrate and configured to perform photoelectric conversion; memories each provided for an associated one of the plurality of photodetectors in the upper portion of the substrate, and each configured to accumulate charge generated by the associated one of the plurality of photodetectors; at least one wiring layer provided above the substrate and including a plurality of metal wires formed therein; a first transparent insulating film provided in a region located directly above the photodetectors and between the plurality of metal wires, and penetrating the wiring layer; a transparent protective film covering the wiring layer and the first transparent insulating film, and having a higher refractive index than the first transparent insulating film; first projections arranged on the transparent protective film, each located above an associated one of the plurality of photodetectors, and each having a quadrilateral shape in top view; and a second transparent insulating film provided over the first projections, and having a lower refractive index than the first projections.

The "quadrilateral shape in top view" includes shapes of which a corner portion is rounded to the extent of variation in manufacturing process, an error, or the like.

The solid-state imaging device disclosed herein employs the global shutter method and is capable of maintaining a high sensitivity and reducing optical noise even when the cell size is reduced.

DETAILED DESCRIPTION

Exemplary embodiments of the present disclosure will now be described with reference to the drawings. The term "cell" as used herein means a minimum unit of region which generates one pixel signal in an imaging region of a solid-state imaging device. The "cell" refers to a region including one photodetector and one memory which accumulates charge generated by the photodetector. The term "cell size" as used herein means a width of the cell on the assumption that the cell has a square shape in top view.

First Embodiment

Figure 1:
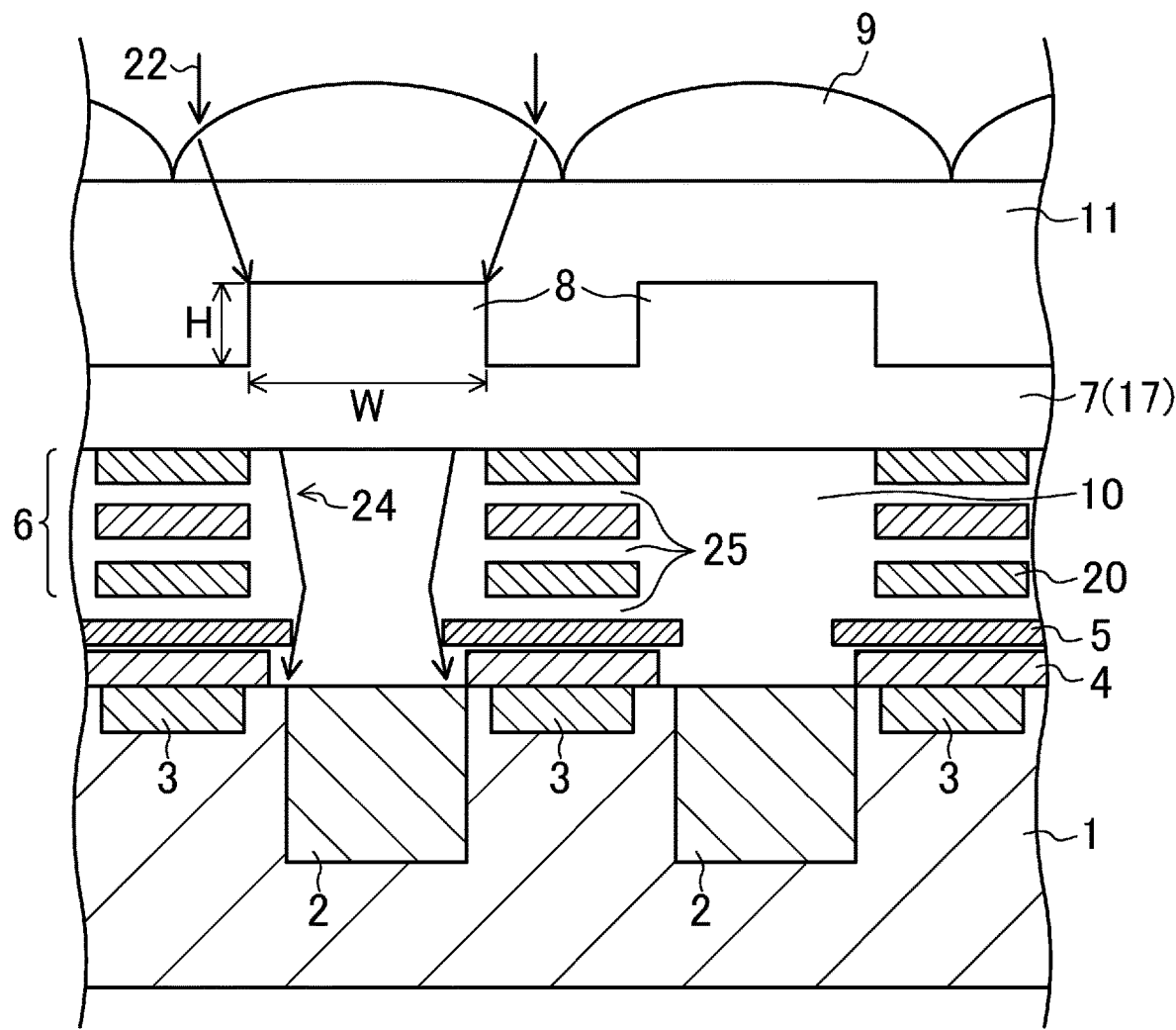
FIG. 1 is a cross-sectional view showing a solid-state imaging device according to a first embodiment.

FIG. 1 is a cross-sectional view showing a solid-state imaging device according to a first embodiment disclosed herein. As shown in FIG. 1, the solid-state imaging device of this embodiment includes: a substrate 1; a plurality of photodetectors 2 provided in an upper portion of the substrate 1 and configured to perform photoelectric conversion; memories 3 each accumulates charge generated by an associated one of the plurality of photodetectors 2; a gate 4 configured to transmit the charge generated by each photodetector 2 through photoelectric conversion to the associated memory 3; at least one wiring layer 6 provided above the substrate 1 and the gate 4, and including a plurality of metal wires 20 formed therein; a light blocking film 5 disposed between the gate 4 and the wiring layer 6 and having openings formed in regions located above the photodetectors 2; and a first transparent insulating film 10 provided in a region located directly above the photodetectors 2 and between the metal wires 20, and penetrating the openings of the light blocking film 5 and the wiring layer 6.

The substrate 1 is comprised of a known semiconductor substrate or the like. For example, a silicon substrate can be used as the substrate 1. It is suitable that each photodetector 2 has a structure capable of converting light that has entered the photodetector 2 into electric charge. For example, each photodetector 2 may be a photodiode including an n-type layer and a p-type layer stacked on the n-type layer. The photodetectors 2 are arranged in, for example, a matrix in an imaging region (not shown). Each memory 3 is arranged between two photodetectors 2 adjacent to each other in a row direction (corresponding to the lateral direction in FIG. 1; hereinafter referred to as the "horizontal direction"). For example, the memory 3 is constituted by an n-type layer in the substrate 1, and a potential barrier is formed between the photodetector 2 and the memory 3.

As shown in FIG. 1, in the case where two or more wiring layers 6 are provided, interlayer insulating films which are made of the same material as the first transparent insulating film 10 may be each provided between two wiring layers 6 vertically adjacent to each other and between the lowermost wiring layer 6 and the light blocking film 5.

The solid-state imaging device according to this embodiment also includes: a passivation film (transparent protective film) 7 covering the wiring layer 6 and the first transparent insulating film 10 and having a higher refractive index than the first transparent insulating film 10; first projections 8 provided on the passivation film 7 and located above the plurality of photodetectors 2; a planarization film (second transparent insulating film) 11 provided on the passivation film 7 and the first projections 8, and having a planar upper surface; and on-chip lenses 9 provided on regions, of the planarization film 11, located above the first projections 8.

The passivation film 7 and the first projections 8 may be made of different materials or the same material. In the example shown in FIG. 1, the passivation film 7 and the first projections 8 are made of the same material, i.e., a transparent material film 17. In this case, a lower portion of the transparent material film 17 forms the passivation film 7 that protects the wiring layers 6, and an upper portion of the transparent material film 17 forms the first projections 8.

In the solid-state imaging device of this embodiment, each first projection 8 is a columnar projection having a quadrilateral shape in top view. Further, as shown in FIG. 1, each first projection 8 has a quadrilateral shape in a longitudinal cross section (cross section in a direction perpendicular to the substrate surface). Furthermore, the first projections 8 have a higher refractive index than the planarization film 11.

As will be described later, this configuration makes it possible to confine light 22 that has entered the first projections 8 within the first projections 8, and to reduce a ratio of an oblique light component of light entering the photodetector 2.

In the solid-state imaging device of this embodiment, for example, the first projections 8 are made of a silicon nitride-based material having a refractive index of about 2.0, and the planarization film 11 may be made of an organic material or the like having a refractive index of about 1.4 to 1.7. Configuring the first projections 8 and the planarization film 11 to significantly differ from each other in the refractive index makes it possible to confine light entering the first projections 8 more effectively and to condense the light to the photodetectors 2. In a preferred embodiment, the difference Δn in the refractive index between the first projections 8 and the planarization film 11 is within the range from about 0.3 to about 0.6.

The passivation film 7 may be made of a silicon nitride-based material, just like the first projections 8. The first transparent insulating film 10 may be made of a silicon oxide-based material having a refractive index of about 1.5. Note that the silicon oxide-based material means a material containing silicon oxide as a main component, and here, the silicon oxide may contain any impurity or the like as long as it has insulating properties. The silicon nitride-based material means a material containing silicon nitride as a main component, and an impurity may be contained in the material.

As shown in FIG. 1, the light 22 that has entered the solid-state imaging device of the present embodiment is refracted by the on-chip lens 9 toward the center axis of the on-chip lens 9, and then, allowed to enter the first projection 8. After having passed through the first projection 8, the light 22 is condensed by the first projection 8. The light 22 then passes through the passivation film 7 and the first transparent insulating film 10, and enters the photodetector 2. The light 24 that has entered the photodetector 2 is converted into electrons. The electrons (charge) generated by this photoelectric conversion are transmitted to the memory 3 through application of a voltage to the gate 4. The charge accumulated in the memory 3 is used as a picture signal, and is subjected to signal processing to form part of a captured image. Since the solid-state imaging device according to this embodiment employs the global shutter method, the photoelectric conversion in the photodetectors 2 and the charge transmission are performed at the same timing for all the pixels.

During the above-described photoelectric conversion, light that has directly entered the memory 3 forms a noise component. This is because photoelectric conversion is performed also in the memory 3. In order to prevent light from entering the memory 3, the light blocking film 5 is provided above the gate 4. Examples of the material for the light blocking film 5 include metals such as tungsten. Tungsten, which has a high light absorption coefficient and exhibits high light-blocking capability even when formed into a thin film, is preferable as the material for the light blocking film 5.

Figure 2:
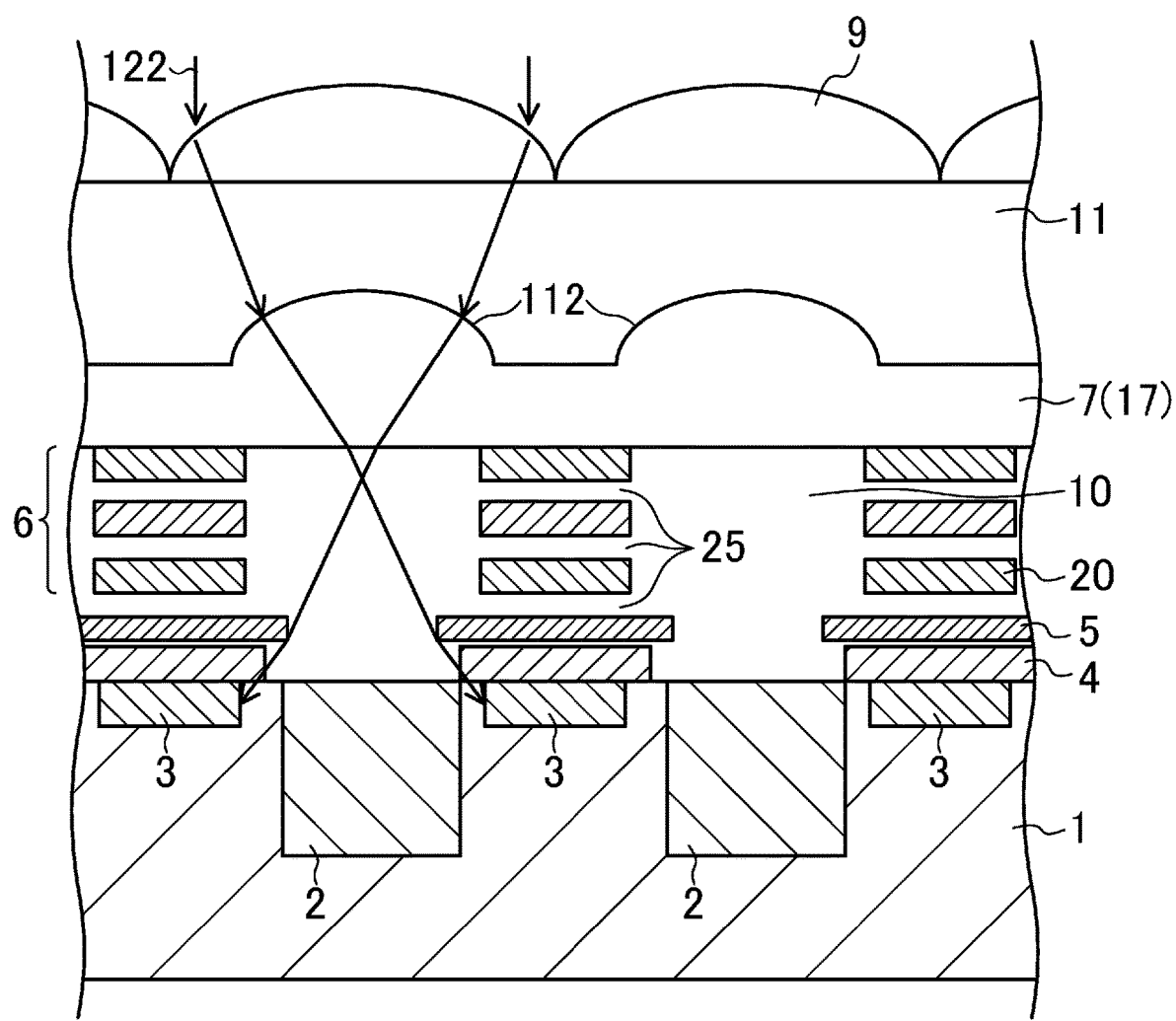
FIG. 2 is a cross-sectional view showing a solid-state imaging device according to a reference example.

FIG. 2 is a cross-sectional view showing a solid-state imaging device according to a reference example. This solid-state imaging device differs from the solid-state imaging device of this embodiment shown in FIG. 1 only in that an upper portion of the transparent material film 17 of the reference example forms substantially hemispherical intra-layer lenses 112 which are convex upward.

In the solid-state imaging device of the reference example, light 122 that has entered the on-chip lens 9 through a peripheral portion thereof is condensed more intensively by the intra-layer lens 112. However, if the cell size is small, as shown in FIG. 2, the light 122 often comes into a focus at a position significantly before the substrate 1. In addition, the light 122 that has passed through the intra-layer lens 112 includes an increased oblique component. For this reason, oblique light directly entering the memory 3 increases. Further, the light with a large inclination is diffracted at an edge portion of the light blocking film 5, and then enters the memory 3. As a result, a noise component increases in the solid-state imaging device of the reference example.

By contrast, in the solid-state imaging device of this embodiment, the first projection 8 is configured as a columnar projection having a quadrilateral shape in top view, and therefore, is less capable of condensing the light 22 than the intra-layer lens 112. Accordingly, first projection 8 can suitably condense the light to the photodetector 2 and reduce the oblique component of the light 22 that has passed through the first projection 8 to a low level. In addition, the solid-state imaging device of this embodiment can reduce the inclination of the light 24 passing near the edge of the light blocking film 5, as compared to the solid-state imaging device of the reference example. Therefore, this embodiment makes diffracted light less likely to enter the memory 3. As a result, the solid-state imaging device of this embodiment can significantly reduce light entering the memory 3, enabling considerable reduction in noise, as compared to the solid-state imaging device of the reference example.

Figure 3:
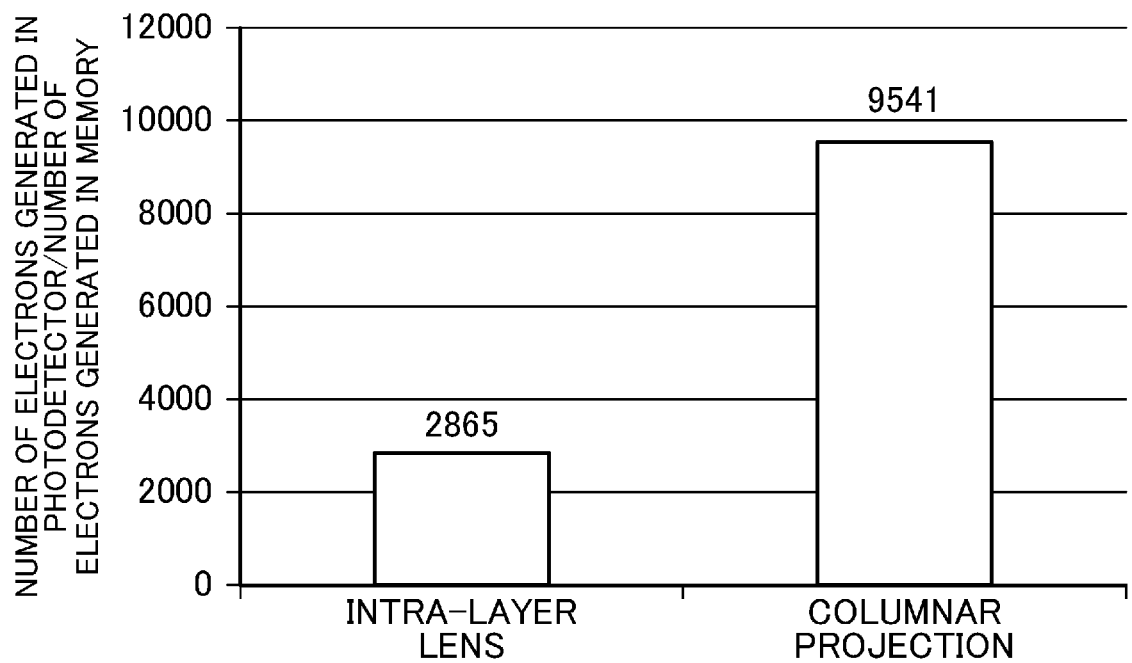
FIG. 3 shows a comparison between a ratio of the number of electrons generated in a photodetector to the number of electrons generated in a memory of the first embodiment and that of the solid-state imaging device of the reference example.

FIG. 3 shows a comparison between a ratio of the number of electrons generated in the photodetector 2 to the number of electrons generated in the memory (the number of electrons generated in the photodetector/the number of electrons generated in the memory) of the first embodiment and that of the solid-state imaging device of the reference example. In FIG. 3, the result of the solid-state imaging device of the reference example is indicated as "Intra-Layer Lens", and the result of the solid-state imaging device of this embodiment is indicted as "Columnar Projection."

The ratio of the number of electrons generated in the photodetector 2 to the number of electrons generated in the memory 3 is used as an index indicating the magnitude of noise. This ratio is often required to be 2000 or more. In the solid-state imaging device of the reference example, the ratio is 2865, whereas in the solid-state imaging device of the present embodiment, the ratio is 9541. As can be seen from the foregoing, it has been confirmed that the solid-state imaging device of this embodiment is capable of achieving a significant reduction of the noise component.

While the solid-state imaging device of the reference example aims to condense light to the photodetector 2 by using the on-chip lens 9 and the intra-layer lens 112, the solid-state imaging device of this embodiment employs, on purpose, the columnar first projection 8 having a low light-condensing capability, instead of the intra-layer lens 112. As shown in FIG. 3, for a solid-state imaging device employing the global shutter method and including small cells, the first projections 8 having the shape as described above is very effective. This finding has been originally made by the present inventors through their unique studies.

The optical waveguide described in Japanese Unexamined Patent Publication No. 2008-192951 is formed in the following manner. Following the formation of a wiring layer 6, portions of a first transparent insulating film 10 that are located above photodetectors 2 are removed to form holes, which are then filled with a material having a high refractive index. However, in the solid-state imaging device of this embodiment, due to the inclusion of the memories 3, the dimension of each of the openings above the photodetectors 2 is smaller than that in a solid-state imaging device having the same size and employing the rolling shutter method. For this reason, if such holes were formed after the formation of the wiring layers 6, each hole would have a high aspect ratio and be difficult to fill with a light refracting material. Therefore, in the solid-state imaging device of this embodiment, no optical waveguide is provided above the photodetectors 2 on purpose.

This configuration can ensure sufficient performance even when the cell size is reduced and contributes to reduction of the manufacturing cost.

As will be described later, the first projections 8 can be formed while the passivation film 7 remains, by the lithography process and the dry etching process. Therefore, the wiring layers 6 are more easily protected in the solid-state imaging device of this embodiment than in the solid-state imaging device of the reference example. Further, the solid-state imaging device of this embodiment can be produced by a simpler manufacturing process.

Figure 4:
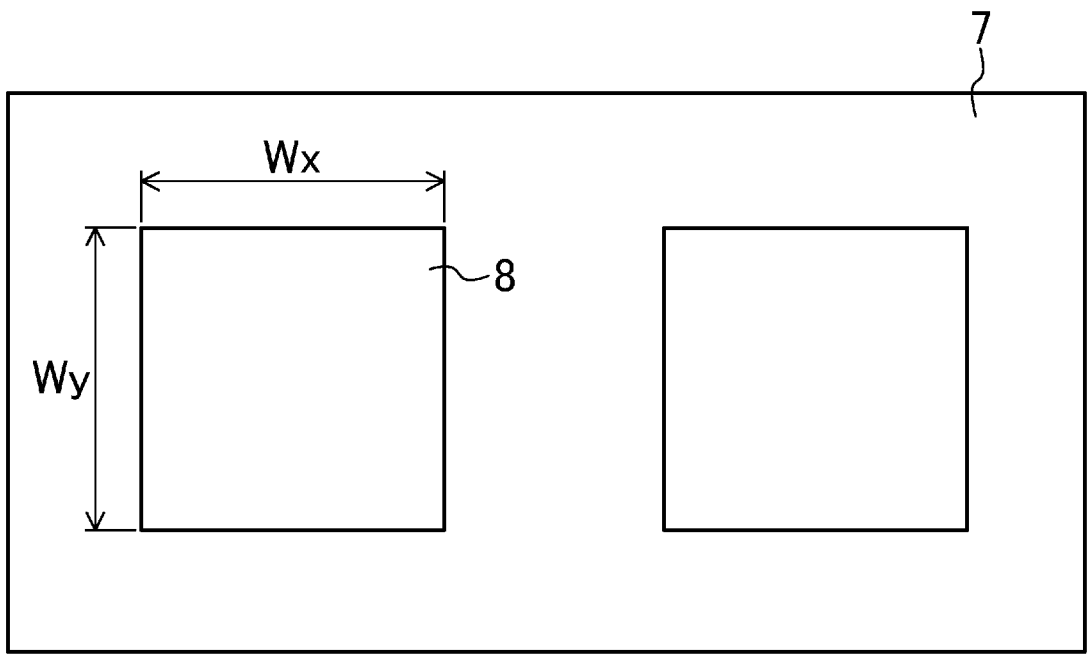
FIG. 4 is a plan view of a passivation film and first projections of the solid-state imaging device of FIG. 1, as viewed from above.

FIG. 4 is a plan view of the passivation film 7 and the first projections 8 of the solid-state imaging device of the embodiment shown in FIG. 1, as viewed from above. In FIG. 4, the passivation film 7 is defined by the outline for the sake of convenience, and actually, the passivation film 7 extends also in the vertical direction and the lateral direction beyond FIG. 4.

It is suitable that the first projection 8 has a quadrilateral shape in top view. As shown in FIG. 4, the first projection 8 may have a square shape of which a width Wx in the horizontal direction and a width Wy in the vertical direction are substantially the same. In recent years, the on-chip lens 9 has been formed by etch-back process in many cases so as to eliminate a horizontal gap in order that the on-chip lens 9 captures as much light as possible. In the case of using the on-chip lens 9 having no horizontal gap, the beam shape of light passing through the on-chip lens 9 is close to a square shape. Therefore, designing the first projection 8 to have a shape, in top view, coinciding with the beam shape of light contributes to prevention of lowering of coupling efficiency and improvement of light-condensing efficiency.

The length of one side of the shape in top view of the first projection 8 may range from 60% to 80% of the cell size. In other words, the width of the first projection 8 in the horizontal direction (the width W shown in FIG. 1) and the width of the first projection 8 in vertical direction both may range from 60% to 80% of the cell size.

The configuration in which the width in the horizontal direction and the width in the vertical direction of the first projection 8 are each set to be 60% or more of the cell size makes it possible to sufficiently introduce the light condensed by the on-chip lens 9, and to reduce the risk of deterioration of sensitivity. In addition, this configuration substantially prevents the first projection 8 from having an excessively high light-confining capability, and makes it easy to reduce the oblique component of the light that has passed through the first projection 8, enabling reduction of noise.

The configuration in which the width in the horizontal direction and the width in the vertical direction of the first projection 8 are each set to be 80% or less of the cell size makes it possible to ensure sufficient light-condensing capability and to reduce the risk of deterioration of sensitivity.

In addition, for example, a color filter (not shown) selectively transmitting light having a wavelength corresponding to any one of a plurality of colors may be formed on a portion of the planarization film 11 located above the first projection 8. In this case, the width in a predetermined direction of the shape in top view of the first projection 8 may be set larger with increase in the wavelength of the light transmitted through the color filter provided above the first projection 8. This configuration can optimize the sensitivity of each pixel according to the associated color, so that the sensitivity of the solid-state imaging device can be improved.

For example, if the first projections 8 are designed to have a square shape in top view and pixels of three colors, i.e., blue (B), green (G), and red (R) are provided, it is preferable that the first projection 8 associated with the blue (B) pixel and having a width WB, the first projection 8 associated with the green (G) pixel and having a width WG, and the first projection 8 associated with the red (R) pixel and having a width WR be in a relationship described as WB<WG<WR.

Since the extent to which the on-chip lens 9 condenses light varies depending on the wavelength of the light, blue light having a short wavelength is condensed to be incident on a small area on the first projection 8, whereas red light having a long wavelength is condensed to be incident on a large area on the first projection 8. For this reason, a highly sensitive solid-state imaging device can be achieved by adopting the configuration described above.

The first projection 8 may have a height H (see FIG. 1) ranging from 5% to 30% of the cell size. The configuration in which the height H is set to be 5% or more of the cell size can ensure that the first projection 8 has a sufficient light-condensing capability, and can reduce the risk of deterioration of sensitivity. This configuration can also ensure that the first projection 8 has a capability of refracting and guiding oblique light, which has entered the first projection 8, to the photodetector 2, thereby reducing the risk of deterioration of the incidence angle properties. The configuration in which the height H is set to be 30% or less of the cell size can substantially prevent the first projection 8 from having an excessively high light-condensing capability, and contributes to prevention of increase in noise.

The first projection 8 may be made of a transparent material having a refractive index of 1.9 or more, apart from the silicon nitride having a refractive index of about 2. This can provide the same effects as those described above. It is preferable that the difference in the refractive index between the first projection 8 and a member which is in direct contact with the first projection 8 be 0.2 or more. Setting the difference in the refractive index to be 0.2 or more makes it possible to substantially prevent, for example, deterioration of the light-condensing capability, the light-confining capability, the sensitivity, and the incident angle properties.

—Method for Producing Solid-State Imaging Device—

FIGS. 5A to 5D illustrate a method for producing the solid-state imaging device according to the first embodiment.

Figure 5A:
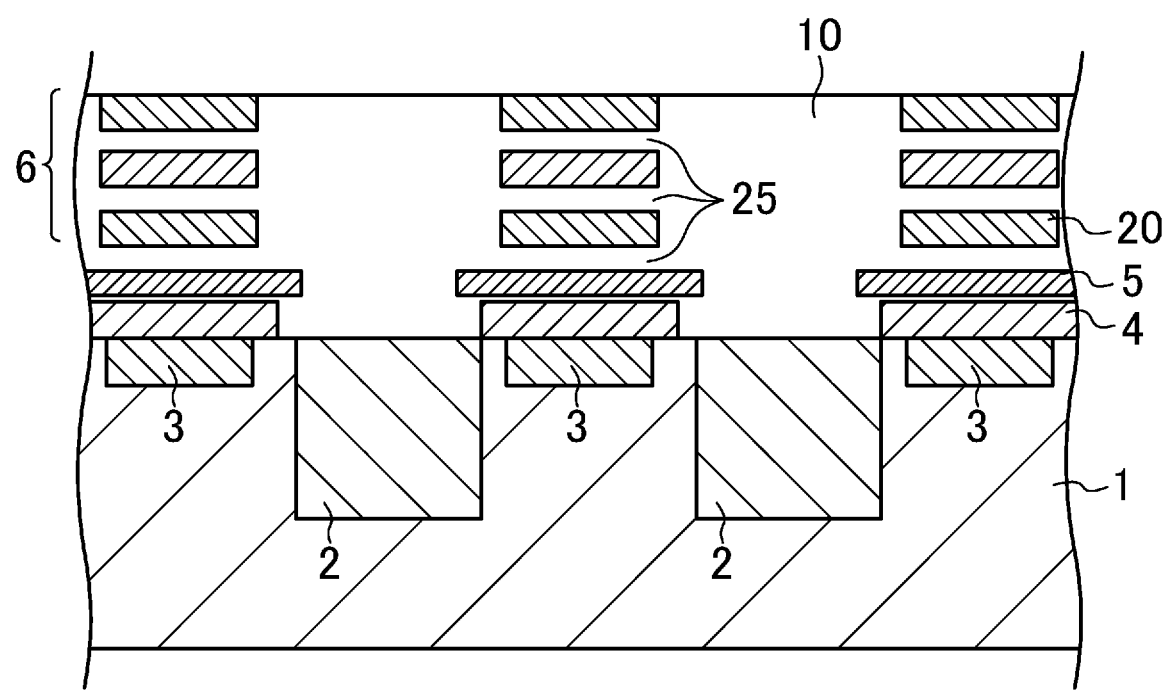
FIG. 5A illustrates a method for producing the solid-state imaging device according to the first embodiment.

First, as shown in FIG. 5A, a substrate 1 made of silicon or the like is subjected to ion implantation or other processes, thereby forming photodetectors 2 and memories 3 adjacent to the photodetectors 2. Next, a gate 4 of polysilicon or the like is formed on the memories 3 by a known lithography process or a known etching process. Subsequently, following formation of an insulating film above the gate 4 and the substrate 1, a light blocking film 5 made of tungsten or the like and having openings located above the photodetectors 2 is formed by, for example, sputtering and dry etching.

Next, a plurality of interlayer insulating films 25 of silicon oxide or the like and a plurality of wiring layers 6 including metal wires 20 formed therein are alternately formed by a known method. Here, among the insulating film and the interlayer insulating films 25 formed over the substrate 1, portions above the photodetectors 2 are hereafter referred to as a first transparent insulating film 10.

Figure 5B:
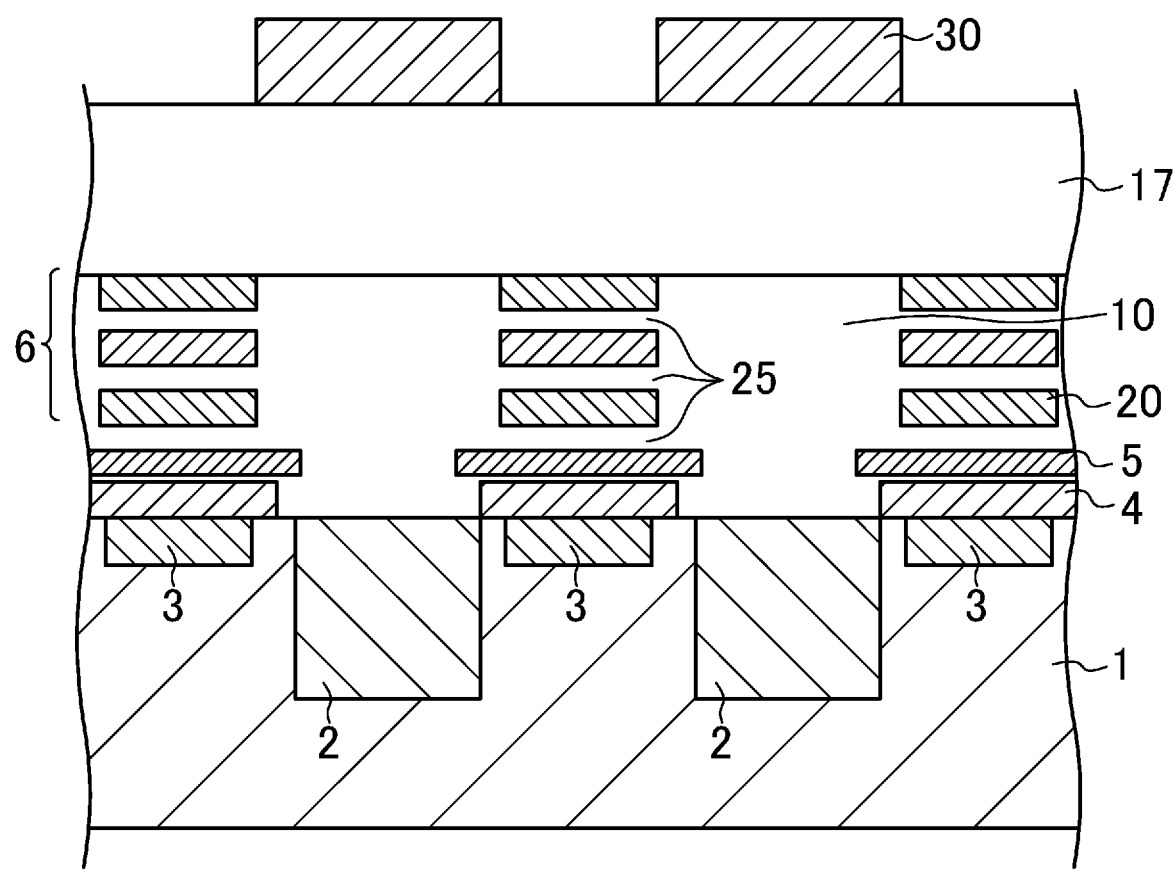
FIG. 5B illustrates the method for producing the solid-state imaging device according to the first embodiment.

Next, as shown in FIG. 5B, after a transparent material film 17 of, for example, silicon nitride is formed by known chemical vapor deposition (CVD), each of portions of the transparent material film 17 located above the photodetectors 2 is covered with a resist mask 30 having a quadrilateral shape in top view.

Figure 5C:
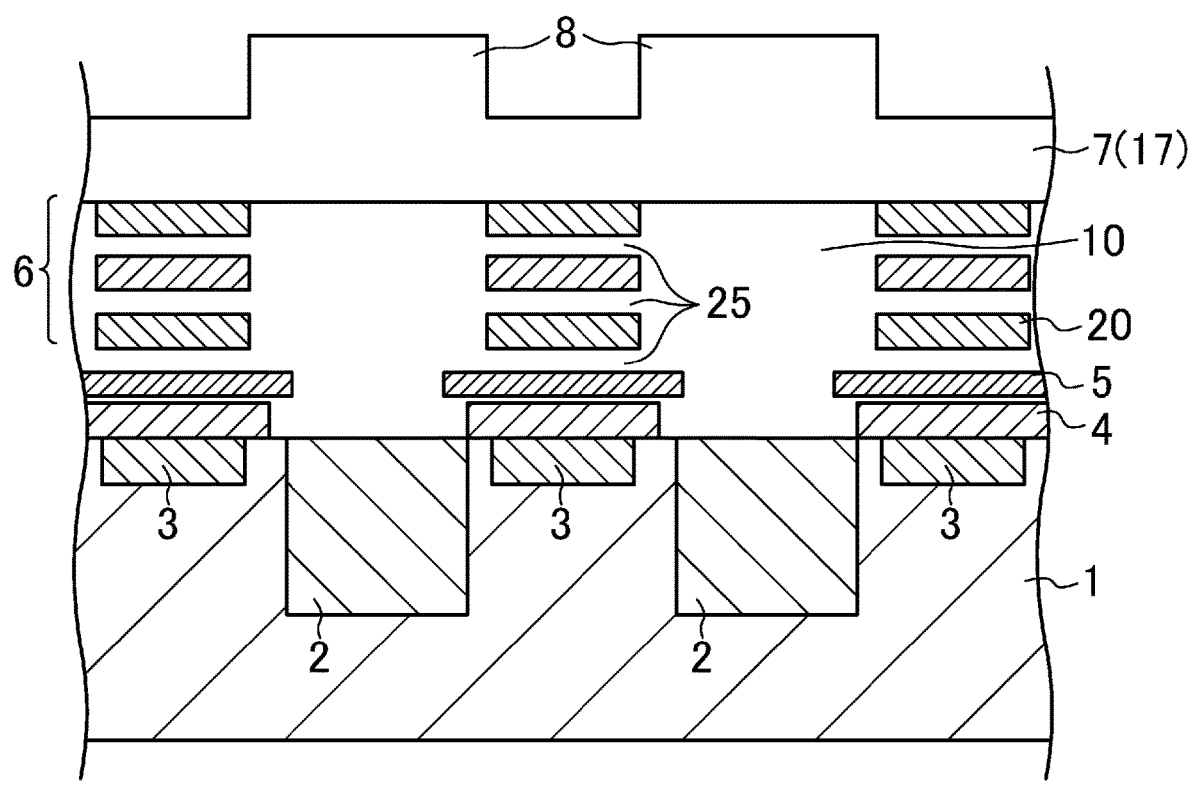
FIG. 5C illustrates the method for producing the solid-state imaging device according to the first embodiment.

Next, as shown in FIG. 5C, after removal of an upper portion of the transparent material film 17 by dry etching, the resist mask 30 is removed, thereby forming a passivation film 7 and first projections 8.

Figure 5D:
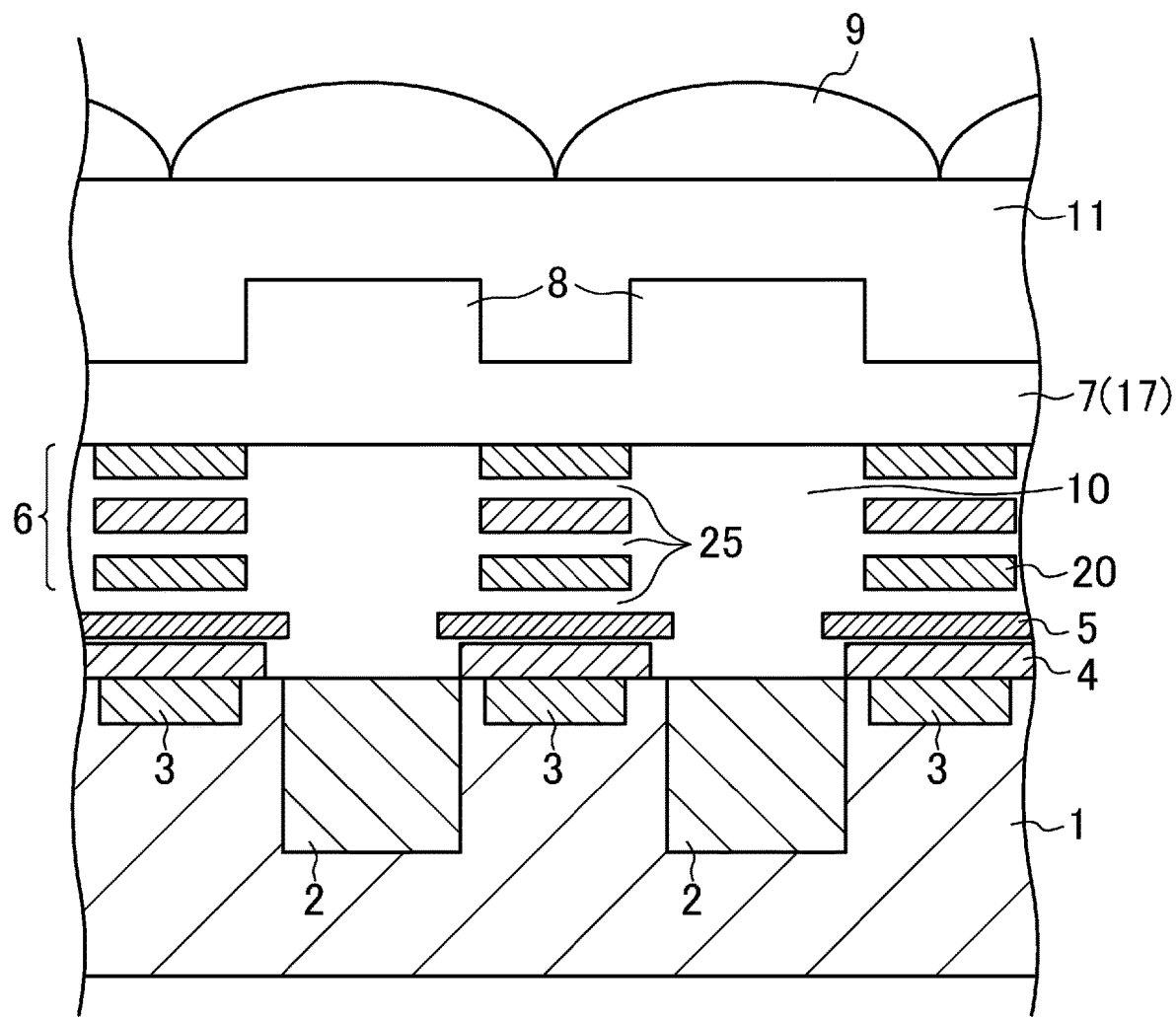
FIG. 5D illustrates the method for producing the solid-state imaging device according to the first embodiment.

Subsequently, as shown in FIG. 5D, a planarization film 11 and on-chip lenses 9 are respectively formed by, for example, spin coating of a transparent polymer resin or the like. Before the formation of the on-chip lenses 9, a color filter may be formed on the planarization film 11. The on-chip lenses 9 are formed by carrying out developing through lithography, sphering through reflow process, and dry etching process, after application of the transparent polymer resin. The solid-state imaging device of this embodiment can be produced in this method.

In the solid-state imaging device of this embodiment, a lower portion of the transparent material film 17 can be used as the passivation film 7 and an upper portion of the transparent material film 17 can be used as the first projections 8. Hence, this embodiment enables reduction in the number of steps and in the manufacturing cost, as compared to the case where intra-layer lenses are provided.

Second Embodiment

Figure 6:
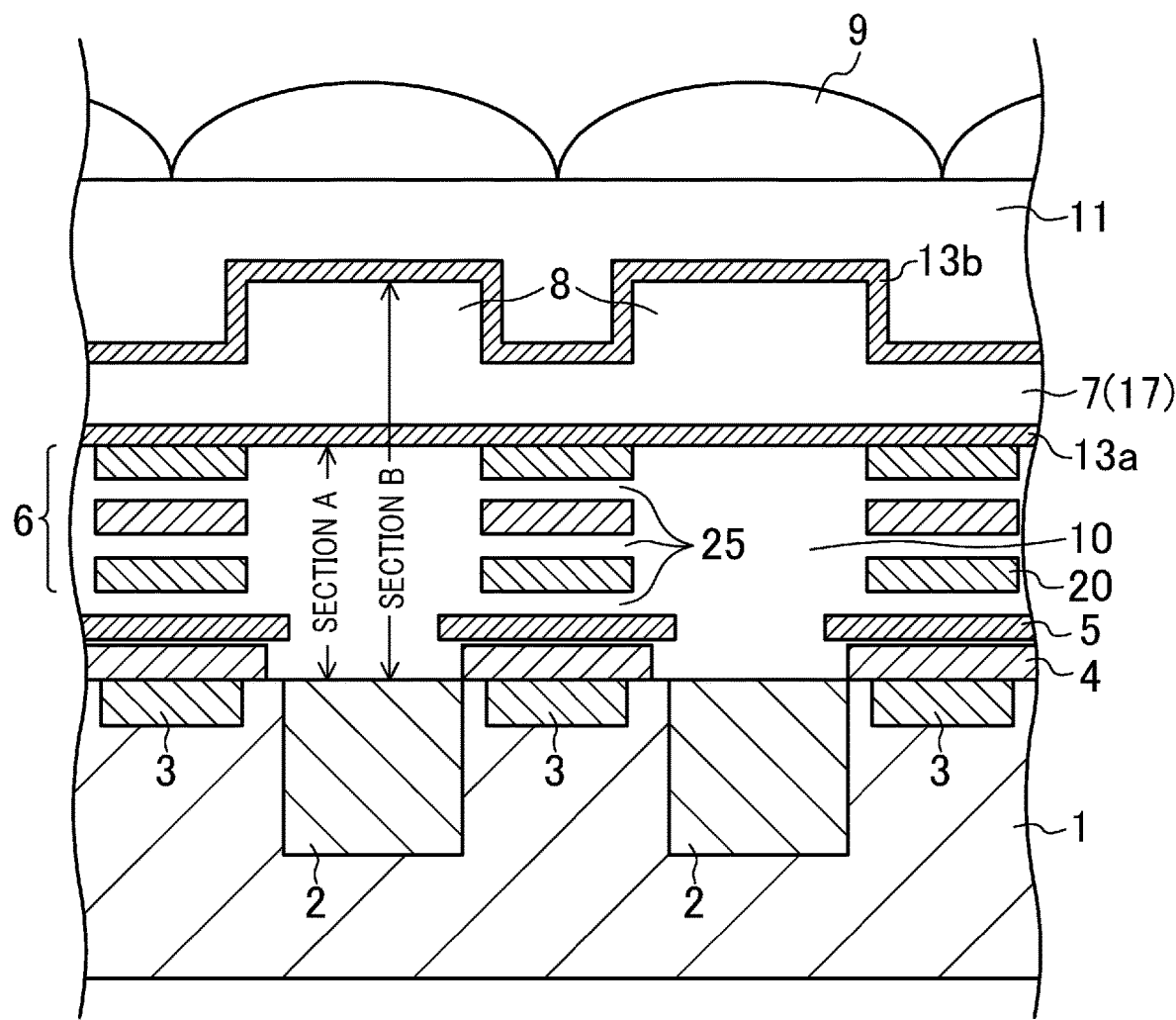
FIG. 6 is a cross-sectional view showing a solid-state imaging device according to a second embodiment.

FIG. 6 is a cross-sectional view showing a solid-state imaging device according to a second embodiment. The description below will focus mainly on differences between this embodiment and the first embodiment shown in FIG. 1.

In the solid-state imaging device of this embodiment, an antireflection film 13a is formed between an uppermost wiring layer 6 and a passivation film 7, and another antireflection film 13b is formed to cover the upper surface of the passivation film 7 and the upper and side surfaces of first projections 8.

A structure provided with first projections 8 having a quadrilateral shape in top view and being in a columnar shape has many flat planes, and therefore, makes it likely that optical interference occurs at a specific wavelength.

For example, sections A and B shown in FIG. 6 are respectively sandwiched between planes having a large difference in the refractive index. Thus, interference is likely to occur at a specific wavelength in these sections. In the solid-state imaging device of this embodiment, the antireflection films 13a and 13b, which are provided on interfaces where interference is likely to occur, can effectively reduce the occurrence of the interference in the sections A and B.

In the solid-state imaging device of this embodiment, for example, the first projection 8 is designed to have a refractive index of about 2, the first transparent insulating film 10 is designed to have a refractive index of about 1.5, and the planarization film 11 is designed to have a refractive index of about 1.5. For this reason, the antireflection films 13a and 13b are formed using a material having a refractive index of about 1.6 to about 1.9 in order to reduce difference in refractive index between these components. The antireflection films 13a and 13b may have a multilayer film structure produced by, for example, stacking an SiON film having a refractive index of about 1.6 and an SiCO film having a refractive index of about 1.7 together. According to this configuration, the refractive index gently varies between the components, making it possible to effectively reduce the occurrence of the interference. As a result, smooth spectral characteristics can be obtained, and degradation of image quality can be substantially prevented.

Note that although the antireflection films 13a and 13b may both be provided, the occurrence of the interference can be reduced by forming only one of them.

Third Embodiment

Figure 7:
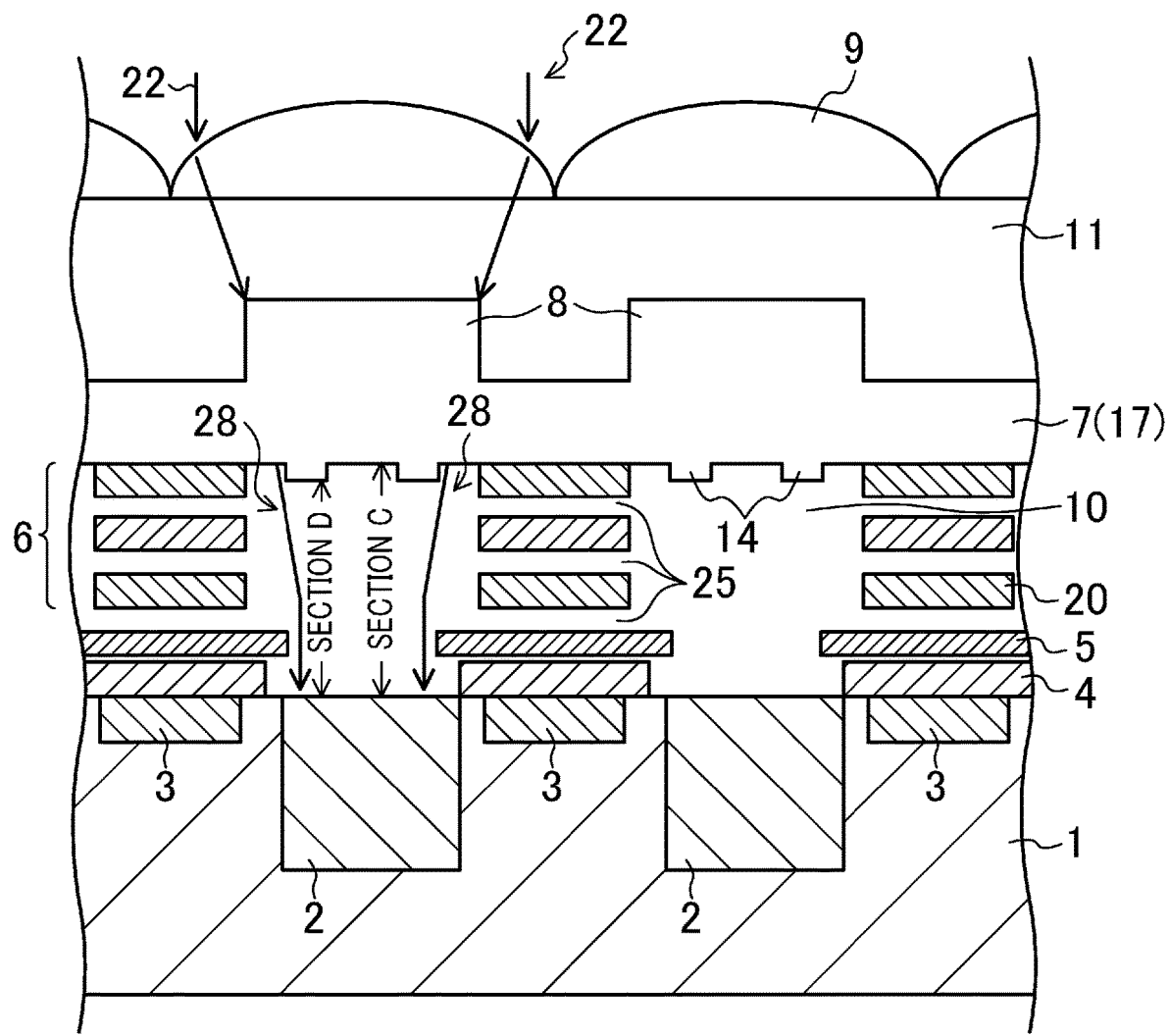
FIG. 7 is a cross-sectional view showing a solid-state imaging device according to a third embodiment.

FIG. 7 is a cross-sectional view showing a solid-state imaging device according to a third embodiment.

As described in the second embodiment, a structure provided with the first projections 8 having a quadrilateral shape in top view and being in a columnar shape has many flat planes, and therefore, makes it likely that optical interference occurs at a specific wavelength.

As shown in FIG. 7, in the solid-state imaging device of this embodiment, second projections 14 project downward toward a first transparent insulating film 10 from a lower surface of a passivation film 7. Each second projection 14 is arranged on a portion of a region located above photodetectors 2. Just like the passivation film 7 and the first projections 8, the second projections 14 may be made of silicon nitride having a high refractive index.

Formation of the second projections 14 can reduce the size of the plane formed in a lower portion of the passivation film 7.

As a result, as shown in FIG. 7, a section C and a section D having two different lengths exist between the lower portion of the passivation film 7 and the substrate 1, making it difficult for phases of the light to coincide with each other. As a result, the solid-state imaging device of this embodiment can reduce the interference at a certain wavelength by half or more.

In addition, the provision of the second projections 14 varies the extent to which light 22 is condensed, the light 22 having passed through the on-chip lens 9, and entering the first projection 8 and the passivation film 7. Since light 28 that has passed through the passivation film 7 is in a state approximate to parallel light, an oblique light component decreases. Thus, the solid-state imaging device of this embodiment can reduce light diffracted by the light blocking film 5, as compared to the case where no second projection 14 is provided. As a result, the solid-state imaging device of this embodiment can reduce the noise caused by the diffracted light by 10% or more, with respect to the noise caused in the solid-state imaging device of the first embodiment.

Figure 8:
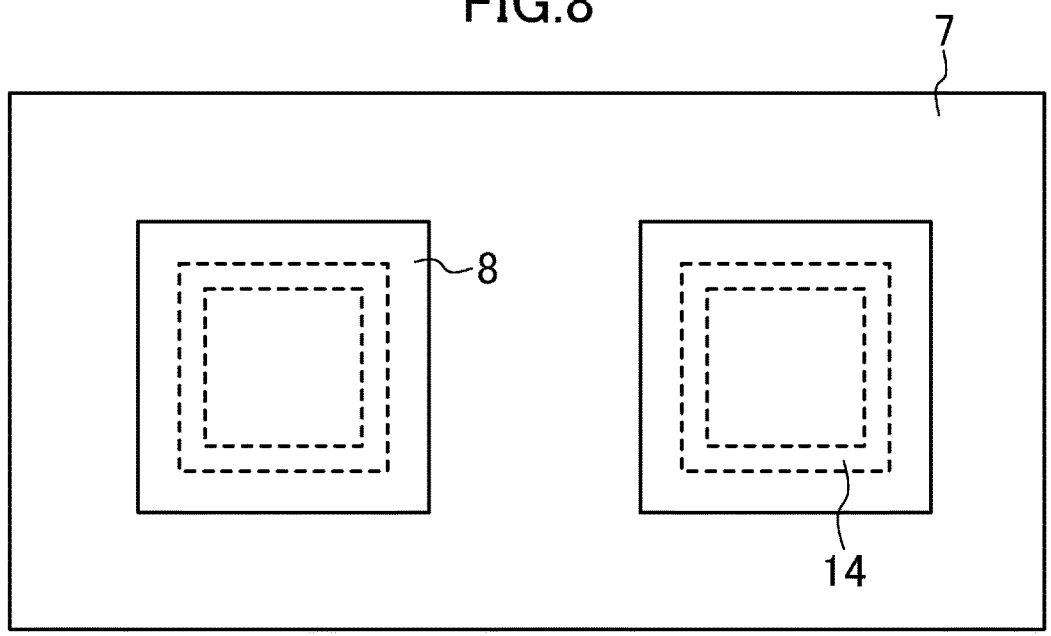
FIG. 8 is a plan view of a passivation film and a first projection of the solid-state imaging device according to the third embodiment, as viewed from above.

FIG. 8 is a plan view of the passivation film 7 and the first projections 8 of the solid-state imaging device of FIG. 7, as viewed from above. As shown in FIG. 8, the second projections 14 may have the shape of a sash in bottom view. If on-chip lenses 9 having no gap in the horizontal direction are provided, the beam shapes of the light 22 and the light 28 entering the first projection 8 and the photodetector 2 are close to a quadrilateral shape, as viewed from above the substrate 1. In this case, by designing the second projection 14 to have the shape of a sash with a quadrilateral contour, the shape of the second projection 14 and the shape of a region surrounded by the second projection 14 easily coincide with the beam shape of the entering light. As a result, the occurrence of optical interference can be reduced more effectively.

As a result, the solid-state imaging device of this embodiment can reduce the occurrence of the interference and capture an image with reduced noise. An optimum size of the second projection 14 is determined appropriately according to the design of the solid-state imaging device.

Figure 9:
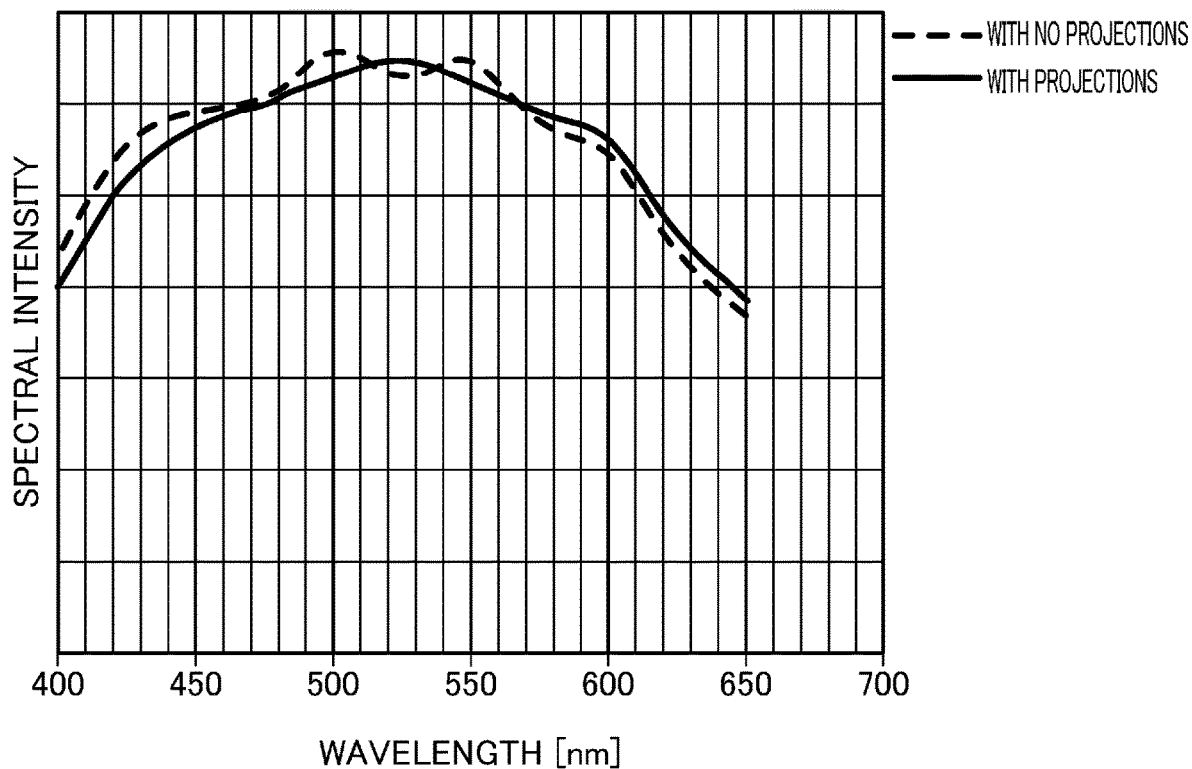
FIG. 9 illustrates wavelengths and spectral intensity of light observed at a photodetector of the solid-state imaging device according to the third embodiment.

FIG. 9 illustrates wavelengths and spectral intensity of light observed at the photodetector of the solid-state imaging device according to the third embodiment. In FIG. 9, "With No Projections" indicates the result of simulation performed on a solid-state imaging device having the same configuration as that of the third embodiment except for the absence of the second projections 14, whereas "With Projections" indicates the result of a simulation performed on the solid-state imaging device of the third embodiment.

As shown in FIG. 9, in the case where no second projection 14 is formed, the intensity of the entering light has amplitudes, depending on the wavelength. In contrast, it has confirmed that in the solid-state imaging device of this embodiment, the second projections 14 allow the spectrum intensity to vary smoothly as the wavelength changes.

The second projections 14 described in this embodiment have the shape of a sash in cross section, as an example. However, reduction of the interference can be suitably achieved by making the lower surface of the passivation film 7 have projections and depressions.

The depth of the second projection 14 may be optimized according to the wavelength of light to be received. In the case of providing blue (B), green (G), and red (R) pixels, the depth may be set to match with green light having the intermediate wavelength among the three colors. Although the depth of the second projection 14 is determined depending on the materials forming the solid-state imaging device, the effect to reduce the interference can be achieved if the depth is about 60 nm or more and about 100 nm or less. If the depth of the second projection 14 is excessively small, the interference prevention effect will also decreases. If the depth of the second projection 14 is excessively large, it will be difficult to fill the holes formed in an upper portion of the first transparent insulating film 10 with a material such as a silicon nitride-based material.

Fourth Embodiment

Figure 10:
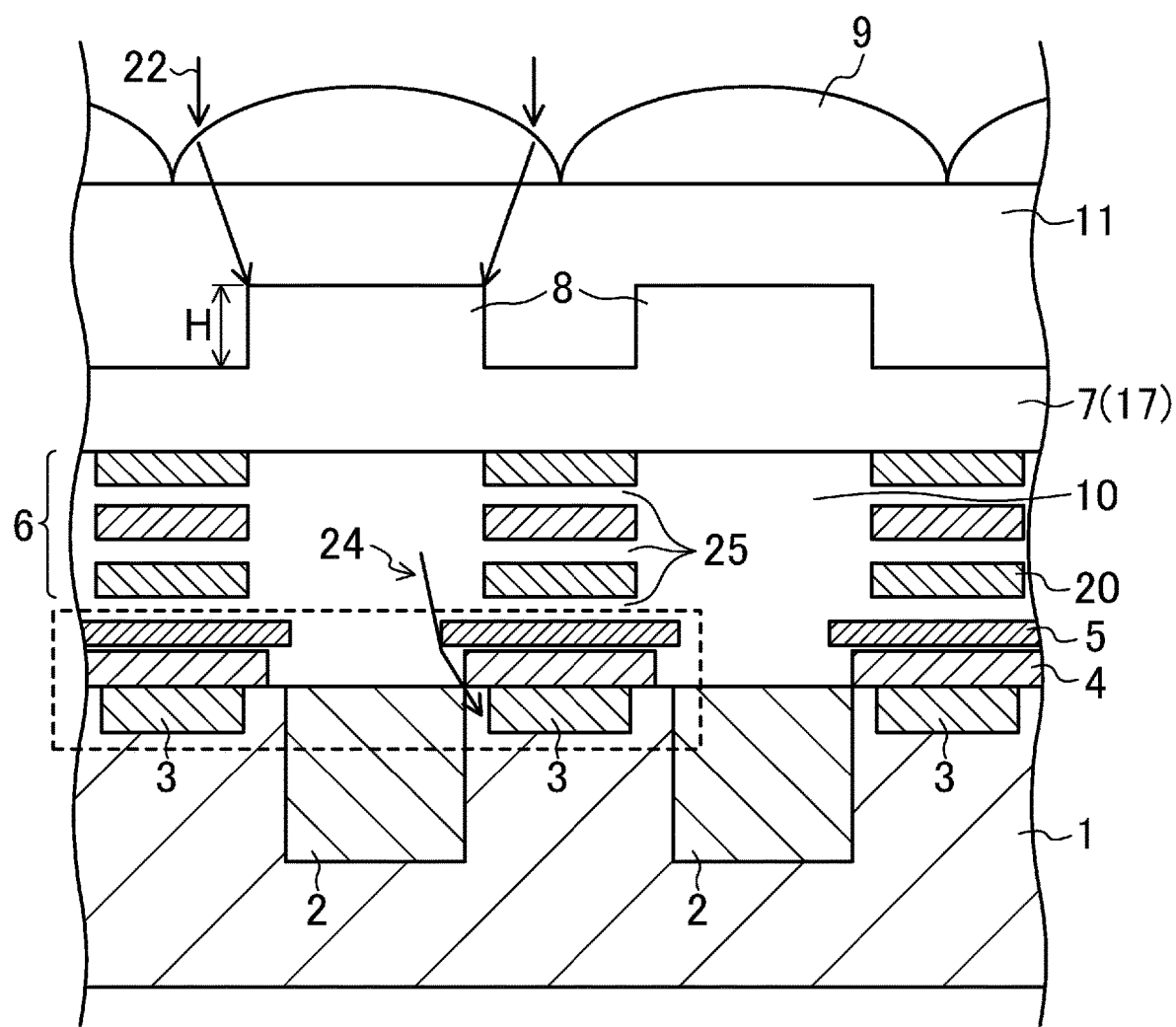
FIG. 10 is a cross-sectional view showing a solid-state imaging device according to a fourth embodiment.
Figure 11A:
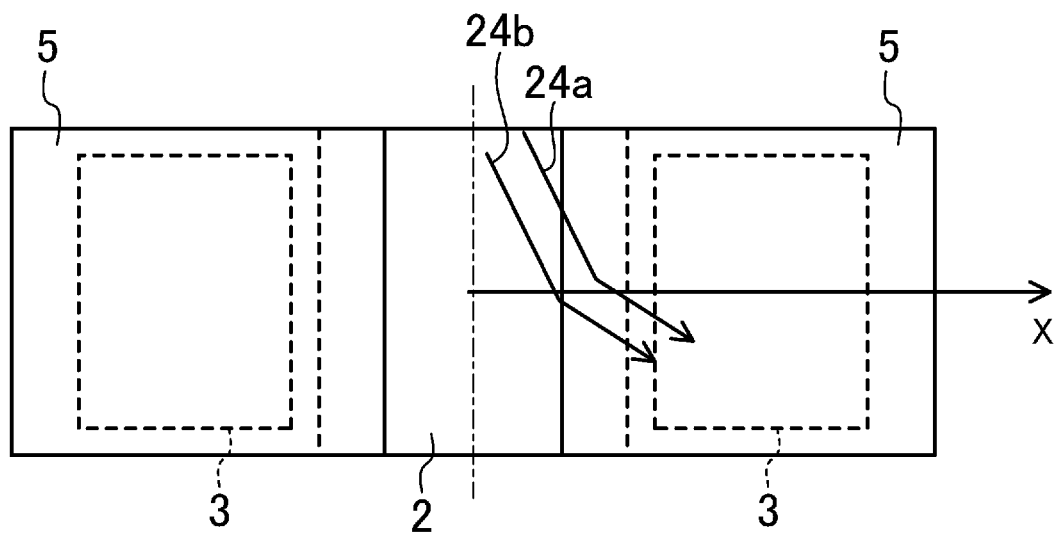
FIG. 11A is a plan view showing the shape of a light blocking film of the solid-state imaging device according to the first embodiment, as viewed from above.
Figure 11B:
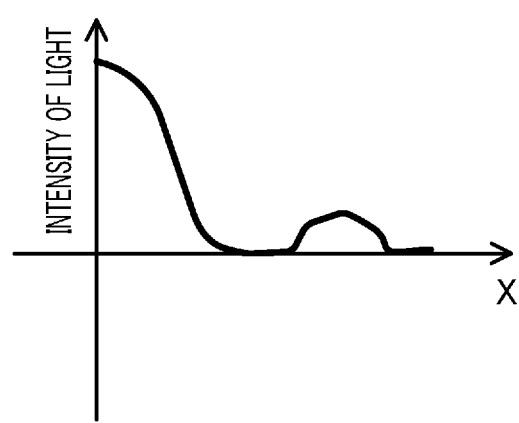
FIG. 11B illustrates intensity of light entering a memory of the solid-state imaging device according to the first embodiment.
Figure 12A:
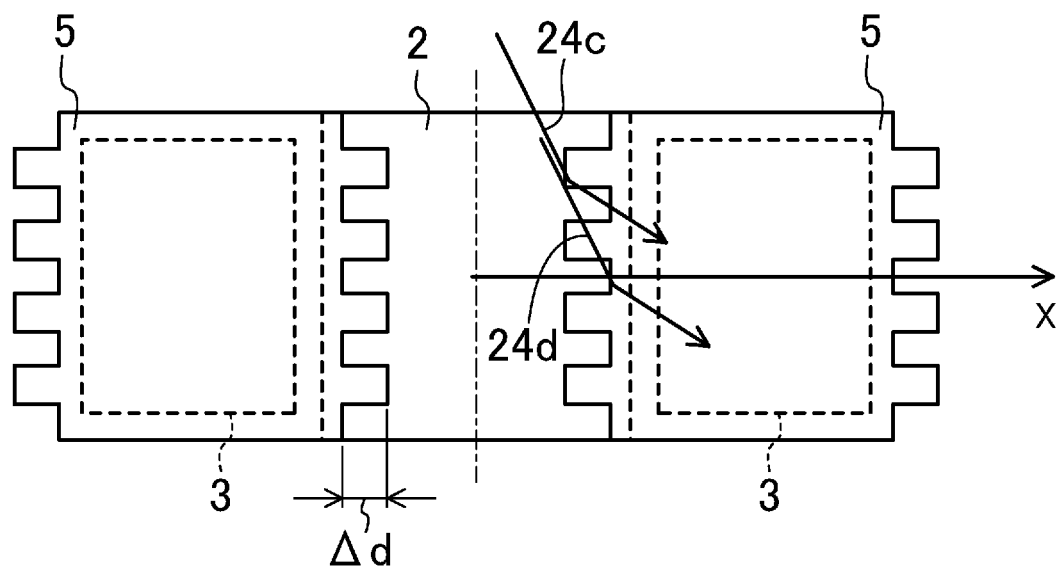
FIG. 12A is a plan view showing the shape of a light blocking film of the solid-state imaging device according to the fourth embodiment.
Figure 12B:
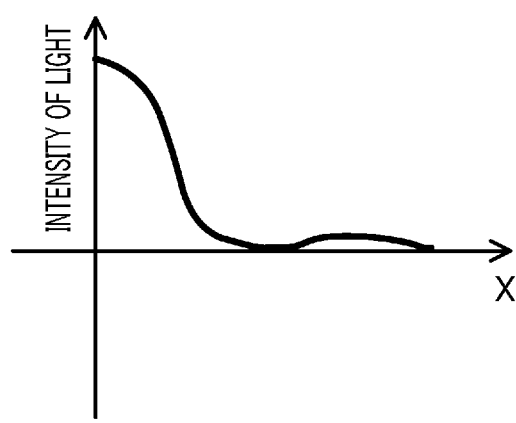
FIG. 12B illustrates intensity of light entering a memory of the solid-state imaging device according to the fourth embodiment.

FIG. 10 is a cross-sectional view showing a solid-state imaging device according to a fourth embodiment. FIG. 11A is a plan view showing the shape of the light blocking film of the solid-state imaging device of the first embodiment, as viewed from above. FIG. 11B illustrates intensity of light entering the memory of the solid-state imaging device of the first embodiment. FIG. 12A is a plan view showing the shape of a light blocking film of the solid-state imaging device of the fourth embodiment, as viewed from above. FIG. 12B illustrates intensity of light entering a memory of the solid-state imaging device of the fourth embodiment.

FIG. 11A and FIG. 12A each show a region corresponding to the part surrounded by the broken line shown in FIG. 10. Further, FIG. 11B shows the intensity of the light entering the memory shown on the right in FIG. 11A. FIG. 12B shows the intensity of the light entering the memory shown on the right in FIG. 12A.

As described previously, if a single slit structure having a light blocking film 5 is adopted, since the light 24 is diffracted at an edge portion of the light blocking film 5, the light causing noise enters the memory 3. In this case, the diffracted light 24a and the diffracted light 24b that have been diffracted at the edge portion of the light blocking film 5 are in the same phase, and consequently, interfere with each other. This may cause the memory 3 to have a portion where the light intensity is strong, as shown in FIG. 11B.

As shown in FIGS. 10 and 12A, in the solid-state imaging device of this embodiment, the light blocking film 5 has, in plan view, projections and depressions in its portions facing the photodetectors 2. In this configuration, since the phase of light 24c diffracted at a projection of the light blocking film 5 and the phase of light 24d diffracted at the depression of the light blocking film 5 are unlikely to coincide with each other, the occurrence of the interference can be reduced (see FIG. 12B). Thus, the solid-state imaging device of this embodiment can achieve a further reduction in noise generated in the memory 3 than the case where then the light blocking film 5 has neither projection nor depression. A comparison between the result shown in FIG. 11B and that shown in FIG. 12B demonstrates that the noise is reduced by 15% or more in the memory 3 of the solid-state imaging device of this embodiment.

The projections and depressions of the light blocking film 5 are each suitably designed to have a width $\Delta d$ according to a wavelength for which noise reduction is intended. In the case of an imaging device for observing visible light, the width $\Delta d$ is suitably set according to light having a wavelength of about 650 nm. In the solid-state imaging device of this embodiment, the width $\Delta d$ may be set to be 100 nm, for example. Alternatively, taking into account the distance between the edge of the memory 3 and the edge of the light blocking film 5, the width $\Delta d$ may be within the range from 50 nm to 150 nm.

As described above, according to the solid-state imaging device disclosed herein, even when the cell size is reduced, the optical noise can be reduced while a high sensitivity is maintained. The configuration of each of the solid-state imaging devices described above is applicable not only to a CMOS image sensor having the global shutter structure, but also to a CCD sensor, and can achieve a high sensitivity and noise reduction at the same time in both cases.

The solid-state imaging device of each of the embodiments described above is merely an example of embodiments of the present disclosure, and the shape, the material, and the size of each component can be modified as appropriate. Each component of the solid-state imaging devices according to the first to fourth embodiments may be combined with another component. For example, the optical interference can be reduced further effectively by employing the antireflection films 13a and 13b of the solid-state imaging device of the second embodiment in the solid-state imaging device of the fourth embodiment.

The solid-state imaging device according to an example of the present disclosure is applicable to imaging devices such as various cameras and portable devices.

What is claimed is:

1. A solid-state imaging device comprising:
    a substrate;
    a plurality of photodetectors provided in an upper portion of the substrate and configured to perform photoelectric conversion;
    memories each provided for an associated one of the plurality of photodetectors in the upper portion of the substrate, and each configured to accumulate charge generated by the associated one of the plurality of photodetectors;
    at least one wiring layer provided above the substrate and including a plurality of metal wires formed therein;
    a first transparent insulating film provided in a region located directly above the photodetectors and between the plurality of metal wires, and penetrating the wiring layer;
    a transparent protective film covering the wiring layer and the first transparent insulating film, and having a higher refractive index than the first transparent insulating film;
    first projections arranged on the transparent protective film, each located above an associated one of the plurality of photodetectors, and each having a quadrilateral shape in top view; and
    a second transparent insulating film provided over the first projections, and having a lower refractive index than the first projections,
    wherein the transparent protective film and the first projections are made of an identical transparent material film, a lower portion of the transparent material film forms the transparent protective film, and an upper portion of the transparent material film forms the first projections.

2. The solid-state imaging device of claim 1, wherein a plurality of cells are formed on the substrate, the cells each including one of the plurality of photodetectors and one of the memories that is associated with the one of the plurality of photodetectors, and a length of one side of the shape in top view of the first projection ranges from 60% to 80% of a size of the cell.

3. The solid-state imaging device of claim 1, wherein a plurality of cells are formed on the substrate, the cells each including one of the plurality of photodetectors and one of the memories that is associated with the one of the plurality of photodetectors, and the first projection has a height ranging from 5% to 30% of a size of the cell.

4. The solid-state imaging device of claim 1, further comprising:

a color filter provided on portions of the second transparent insulating film located above the first projections, and selectively transmitting light having a wavelength corresponding to any one of a plurality of colors, wherein a width in a predetermined direction of the shape of the first projection in top view is set larger with increase in the wavelength of the light transmitted through the color filter provided above the first projection.

5. The solid-state imaging device of claim 1, wherein the wiring layer includes two or more wiring layers, and an interlayer insulating film which is made of the same material as the first transparent insulating film is provided between vertically adjacent two of the wiring layers.

6. The solid-state imaging device of claim 1, wherein a refractive index of the first projections is higher by 0.3 or more and 0.6 or less than that of the second transparent insulating film.

7. The solid-state imaging device of claim 1, wherein the first transparent insulating film is made of a silicon oxide-based material, and the transparent protective film and the first projections are each made of a silicon nitride-based material.

8. The solid-state imaging device of claim 1, wherein the first projections each have a square shape in top view.

9. The solid-state imaging device of claim 1, further comprising:

an antireflection film covering upper and side surfaces of the first projections.

10. The solid-state imaging device of claim 1, wherein second projections project downward toward the first transparent insulating film, each of the second projections being formed in a portion of each of regions, of a lower surface of the transparent protective film, located above the plurality of photodetectors.

11. The solid-state imaging device of claim 10, wherein the second projections each have a quadrilateral contour, as viewed from below.

12. The solid-state imaging device of claim 10, wherein the second projections each have a depth ranging from 60 nm to 100 nm.

13. The solid-state imaging device of claim 1, further comprising:

a gate formed on the memories and configured to transmit the charge generated by each of the plurality of photodetectors to the associated memory;

a light blocking film disposed between the gate and the wiring layer and having openings formed in regions above the plurality of photodetectors; and on-chip lenses provided on regions, of the second transparent insulating film, located above the first projections.

* * * * *